US012579947B2

(12) United States Patent
Park et al.

(10) Patent No.: US 12,579,947 B2
(45) Date of Patent: Mar. 17, 2026

(54) DISPLAY DEVICE

(71) Applicant: Samsung Display Co., LTD., Yongin-si (KR)

(72) Inventors: Jun Hyun Park, Yongin-si (KR); Young Wan Seo, Yongin-si (KR)

(73) Assignee: Samsung Display Co., LTD., Yongin-si (KR)

( * ) Notice: Subject to any disclaimer, the term of this patent is extended or adjusted under 35 U.S.C. 154(b) by 0 days.

(21) Appl. No.: 18/794,281

(22) Filed: Aug. 5, 2024

(65) Prior Publication Data

US 2025/0157419 A1 May 15, 2025

(30) Foreign Application Priority Data

Nov. 15, 2023 (KR) ........................ 10-2023-0158133

(51) Int. Cl.
| | |
|---|---|
| *H10K 59/121* | (2023.01) |
| *G09G 3/3266* | (2016.01) |
| *G09G 3/3291* | (2016.01) |
| *H10K 59/12* | (2023.01) |
| *H10K 59/126* | (2023.01) |
| *H10K 59/131* | (2023.01) |

(Continued)

(52) U.S. Cl.
CPC ......... *G09G 3/3291* (2013.01); *G09G 3/3266* (2013.01); *H10K 59/1213* (2023.02); *H10K 59/1216* (2023.02); *H10K 59/126* (2023.02); *H10K 59/131* (2023.02); *G06F 3/0412* (2013.01); *G06F 3/044* (2013.01); *H10K 59/12* (2023.02)

(58) Field of Classification Search
CPC .............. G09G 3/3291; G09G 3/3266; H10K 59/1213; H10K 59/1216; H10K 59/131; H10K 59/126; H10K 59/12; G06F 3/0412; G06F 3/044
See application file for complete search history.

(56) References Cited

U.S. PATENT DOCUMENTS

| | | | |
|---|---|---|---|
| 12,190,804 B2 * | 1/2025 | Sun ...................... | H10D 86/441 |
| 2024/0155881 A1 * | 5/2024 | Liu ........................ | H10K 59/40 |

FOREIGN PATENT DOCUMENTS

| | | |
|---|---|---|
| KR | 10-2023-0010081 | 1/2023 |
| KR | 10-2023-0034469 | 3/2023 |
| KR | 10-2023-0055471 | 4/2023 |

* cited by examiner

*Primary Examiner* — Douglas Wilson
(74) *Attorney, Agent, or Firm* — F. CHAU & ASSOCIATES, LLC

(57) ABSTRACT

A display device comprises an active layer on a substrate, a first metal layer above the active layer, a second metal layer above the first metal layer, a first transistor comprising a semiconductor region in the active layer, a drain electrode on a first side of the semiconductor region, a source electrode on a second side opposite the first side of the semiconductor region, and a gate electrode in the second metal layer, a first capacitor comprising a first capacitor electrode in the first metal layer and electrically connected to the gate electrode of the first transistor, a second capacitor comprising a second capacitor electrode in the first metal layer and electrically connected to a driving voltage line supplying a driving voltage, and a shielding electrode in the second metal layer and overlapping with the first capacitor electrode, the second capacitor electrode, and the drain electrode of the first transistor.

20 Claims, 8 Drawing Sheets

(51) Int. Cl.
G06F 3/041          (2006.01)
G06F 3/044          (2006.01)

MTL1: BE5, BE1, BE2, BE3, BE4
ACTL: DE5, ACT5, SE5, DE1, ACT1
MTL2: GE5, GE1, CPE1
MTL3: SDE
MTL4: VDDL, CE1, CE3

DISPLAY DEVICE

CROSS REFERENCE TO RELATED APPLICATION(S)

This U.S. non-provisional patent application claims priority to and benefits of Korean Patent Application No. 10-2023-0158133 under 35 U.S.C. § 119, filed on Nov. 15, 2023, in the Korean Intellectual Property Office, the entire contents of which are incorporated herein by reference.

BACKGROUND

1. Technical Field

The disclosure relates to a display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions. A display device, in which each of the pixels of the display panel includes a light-emitting element that can emit light by itself, can display images without a light emitting device that supplies light to the display panel.

The display device includes pixels, data lines and gate lines electrically connected to the pixels, a data driver that supplies data voltages to the data lines, and a gate driver that supplies gate signals to the gate lines. The data driver and the gate driver may drive the pixels at a selectable frequency.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The technical objectives to be achieved by the disclosure are not limited to those described herein, and other technical objectives that are not mentioned herein would be clearly understood by a person skilled in the art from the description of the disclosure.

Aspects of the disclosure provide a display device that may prevent compensation errors of a first transistor and improve image quality.

It should be noted that objects of the disclosure are not limited to the above-mentioned object; and other objects of the disclosure will be apparent to those skilled in the art from the following descriptions.

According to an embodiment, a display device comprises an active layer disposed on a substrate, a first metal layer disposed above the active layer, a second metal layer disposed above the first metal layer, a first transistor comprising a semiconductor region disposed in the active layer, a drain electrode disposed on a first side of the semiconductor region, a source electrode disposed on a second side opposite to the first side of the semiconductor region, and a gate electrode disposed in the first metal layer, a first capacitor comprising a first capacitor electrode disposed in the first metal layer and electrically connected to the gate electrode of the first transistor, a second capacitor comprising a second capacitor electrode disposed in the first metal layer and electrically connected to a driving voltage line supplying a driving voltage, and a shielding electrode disposed in the second metal layer and overlapping with the first capacitor electrode, the second capacitor electrode, and the drain electrode of the first transistor.

The display device may further comprise a light-emitting element that receives a driving current from the first transistor. The shielding electrode may be electrically connected to a first electrode of the light-emitting element.

The display device may further comprise a first connection electrode disposed in a third metal layer above the second metal layer and electrically connecting the source electrode of the first transistor with the shield electrode.

The display device may further comprise a bias electrode of the first transistor that may be disposed in a fourth metal layer below the active layer, overlaps the semiconductor region of the first transistor, and may be electrically connected to the shielding electrode through the first connection electrode.

The display device may further comprise a data line supplying a data voltage, a first gate line supplying a first gate signal, and a second transistor comprising a semiconductor region disposed in the active layer, a drain electrode electrically connected to the data line, a source electrode electrically connected to the gate electrode of the first transistor, and a gate electrode disposed in the first metal layer and electrically connected to the first gate line.

The first and second capacitors may be disposed between the first gate line and the first transistor in a plan view.

The display device may further comprise a bias electrode of the second transistor that may be disposed in a fourth metal layer below the active layer, overlaps the semiconductor region of the second transistor, and may be electrically connected to the gate electrode of the second transistor.

The display device may further comprise a reference voltage line supplying a reference voltage, a second gate line supplying a second gate signal, and a third transistor comprising a semiconductor region disposed in the active layer, a drain electrode electrically connected to the reference voltage line, a source electrode electrically connected to the gate electrode of the first transistor, and a gate electrode disposed in the first metal layer and electrically connected to the second gate line.

The first and second capacitors may be disposed between the second gate line and the first transistor in a plan view.

The display device may further comprise a bias electrode of the third transistor that may be disposed in a fourth metal layer below the active layer, overlaps the semiconductor region of the third transistor, and may be a part of the second gate line.

The display device may further comprise an initialization voltage line supplying an initialization voltage, a third gate line supplying a third gate signal, and a fourth transistor comprising a semiconductor region disposed in the active layer, a drain electrode electrically connected to the source electrode of the first transistor, a source electrode electrically connected to the initialization voltage line, and a gate electrode disposed in the first metal layer and electrically connected to the third gate line.

The display device may further comprise a bias electrode of the fourth transistor that may be disposed in a fourth metal layer below the active layer, overlaps the semiconductor region of the fourth transistor, and may be a part of the third gate line.

The display device may further comprise an emission control line supplying an emission signal, and a fifth transistor comprising a semiconductor region disposed in the active layer, a drain electrode electrically connected to the driving voltage line, a source electrode electrically connected to the drain electrode of the first transistor, and a gate electrode disposed in the first metal layer and electrically connected to the emission control line.

The display device may further comprise a bias electrode of the fifth transistor that may be disposed in a fourth metal layer below the active layer, overlaps the semiconductor region of the fifth transistor, and may be electrically connected to the gate electrode of the fifth transistor.

The emission control line may be disposed between the third gate line and the first transistor in a plan view.

The display device may further comprise a light-emitting element disposed in a third metal layer on the second metal layer, a sixth transistor electrically connected between the source electrode of the first transistor and a first electrode of the light-emitting element, and a seventh transistor discharging a source electrode of the sixth transistor and the first electrode of the light-emitting element.

According to an embodiment, a fingerprint sensor comprises a first gate line extended in a first direction and supplying a first gate signal, a light-emitting element disposed on the first gate line, a first transistor supplying a driving current to the light-emitting element, a second transistor supplying a data voltage to a gate electrode of the first transistor based on the first gate signal, a first capacitor formed between the gate electrode of the first transistor and a source electrode of the first transistor, and a shielding electrode electrically connected to the source electrode of the first transistor and corresponding to a second electrode of the first capacitor. The first capacitor may be disposed between the first gate line and the first transistor in a plan view.

The shielding electrode may be disposed on the first transistor and overlaps a drain electrode of the first transistor.

The display device may further comprise a second gate line extended in the first direction and supplying a second gate signal, and a third transistor supplying a reference voltage to the gate electrode of the first transistor based on the second gate signal. The first capacitor may be disposed between the second gate line and the first transistor in a plan view.

The display device may further comprise a third gate line extended in the first direction and supplying a third gate signal, an emission control line extended in the first direction and supplying an emission signal, a fourth transistor discharging a first electrode of the light-emitting element based on the third gate signal, and a fifth transistor supplying a driving voltage to a drain electrode of the first transistor based on the emission signal.

According to embodiments of the disclosure, a shielding electrode may cover the upper surface of the drain electrode of the first transistor in a display device, so that it may be possible to prevent the voltage of the drain electrode of the first transistor from being electrically connected to the drain electrode, thereby preventing compensation errors of the first transistor and improving the image quality of the display device.

It should be noted that effects of the disclosure are not limited to those described above and other effects of the disclosure will be apparent to those skilled in the art from the following descriptions.

4

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
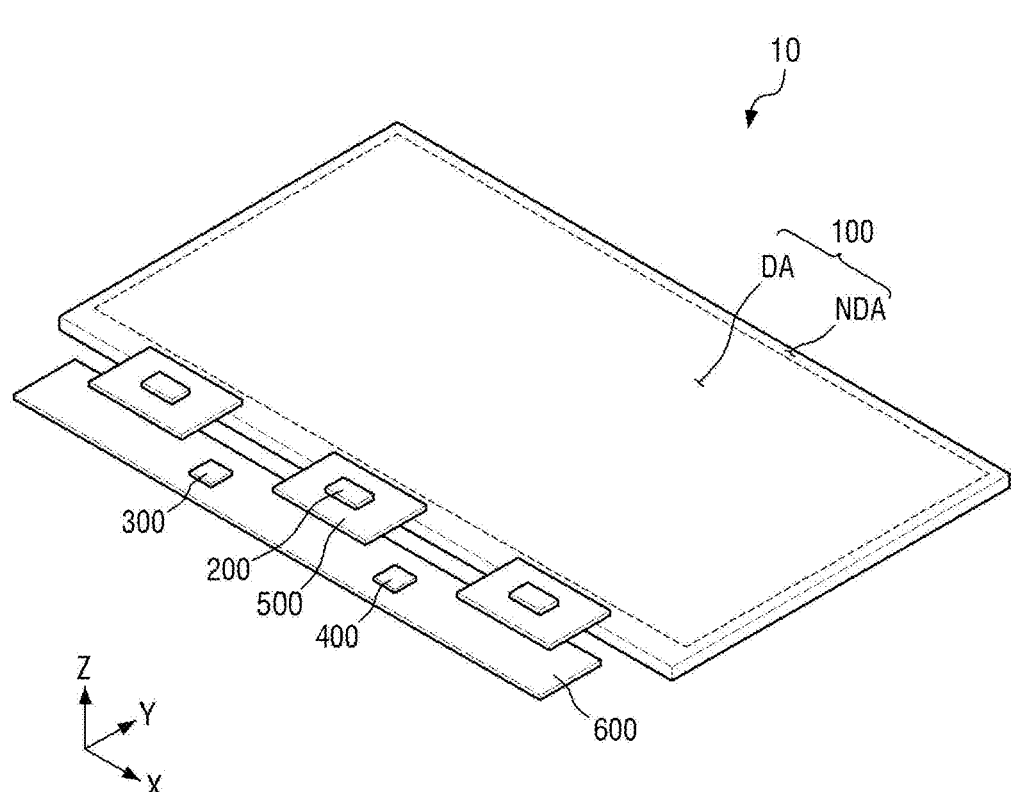
FIG. 1 is a perspective view showing a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers and/or reference characters refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap", "overlapping", or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or "to not overlap" another element, this may include that the elements are spaced apart from each other, offset from each other, or set aside from each other or any other suitable term as would be appreciated and understood by those of ordinary skill in the art.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

It will be understood that when an element (or a region, a layer, a portion, or the like) is referred to as "being on", "disposed on", "connected to" or "coupled to" another element in the specification, it can be directly disposed on, connected or coupled to another element mentioned above, or intervening elements may be disposed therebetween. It will be understood that the terms "connected to" or "coupled to" may include a physical or electrical connection or coupling.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", "side" (e.g., as in "sidewall"), or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below"

or "beneath" another device may be placed "above" another device. Accordingly, the illustrative term "below" may include both the lower and upper positions. The device may also be oriented in other directions and thus the spatially relative terms may be interpreted differently depending on the orientations. An element or component also may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise.

The terms "comprises," "comprising," "includes," and/or "including," "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About", "approximately", "substantially," or other similar terms as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

The phrase "in a plan view" means viewing the object from the top, and the phrase "in a schematic cross-sectional view" means viewing a cross-section of which the object is vertically cut from the side. Hence, the expression "in a plan view" used herein may mean that an object is viewed in a third direction "Z" from the top. The phrase "in a schematic cross-sectional view" means viewing a cross-section in a first direction "X" or a second direction "Y" of which the object is vertically cut from the side. The direction "Z" also can be referred to as a "thickness direction".

It will be understood that when an element (or a region, a layer, a portion, or the like) is referred to as "being on", "disposed on", "connected to" or "coupled to" another element in the specification, it can be directly disposed on, connected or coupled to another element mentioned above, or intervening elements may be disposed therebetween. It will be understood that the terms "connected to" or "coupled to" may include a physical or electrical connection or coupling.

In case that an element is referred to as being "in contact" or "contacted" or the like to another element, the element may be in "electrical contact" or in "physical contact" with another element; or in "indirect contact" or in "direct contact" with another element.

A description that a component is "configured to" perform a specified operation may be defined as a case where the component is constructed and arranged with structural features that can cause the component to perform the specified operation.

Embodiments may be described and illustrated in the accompanying drawings in terms of functional blocks, units, parts, and/or modules.

Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies.

In the case of the blocks, units, parts, and/or modules being implemented by microprocessors or other similar hardware, they may be programmed and controlled using software (for example, microcode) to perform various functions discussed herein and may optionally be driven by firmware and/or software.

It is also contemplated that each block, unit, part, and/or module may be implemented by dedicated hardware, or as a combination of dedicated hardware to perform some functions and a processor (e.g., one or more programmed microprocessors and associated circuitry) to perform other functions.

Each block, unit, part, and/or module of embodiments may be physically separated into two or more interacting and discrete blocks, units, parts, and/or modules without departing from the scope of the disclosure.

Further, the blocks, units, parts, and/or modules of embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

Hereinafter, embodiments of the disclosure will be described in detail with reference to the accompanying drawings.

FIG. 1 is a perspective view showing a display device according to an embodiment of the disclosure.

Referring to FIG. 1, a display device 10 may display moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and an ultra mobile PC (UMPC), as well as the display screen of various products such as a television, a notebook, a monitor, a billboard and the Internet of Things.

The display device 10 may include a display panel 100, a display driver 200, a timing controller 300, a power supply 400, a data circuit board 500, and a control circuit board 600, or a combination thereof.

The display panel 100 may have a quadrangle shape (e.g., a rectangular shape) in a plan view and a planar surface extending in a first direction and a second direction in a schematic cross-sectional view. For example, the display panel 100 may have longer sides in a first direction (x-axis direction) and shorter sides in a second direction (y-axis direction) intersecting the first direction (x-axis direction). Each of the corners where the longer side in the first direction (x-axis direction) meets the shorter side in the second direction (y-axis direction) may be rounded with a selectable curvature or may be a right angle. The shape of the display panel 100 in a plan view is not limited to a quadrangular shape, but may be formed in a different polygonal shape, a circular shape, or an elliptical shape. The display panel 100 may be formed flat, but the disclosure is not limited thereto. For example, the display panel 100 may be formed at left and right ends, and may include a curved portion having a constant curvature or a varying curvature. The display panel 100 may be formed to be flexible so that it can be curved, bent, folded or rolled.

The display panel 100 may include a display area DA where images may be displayed, and a non-display area NDA disposed around the display area DA. The display area DA may occupy most of the area of the display panel 100. The display area DA may be disposed at the center of display device 100. The display area DA may include pixels for displaying images.

Each of the pixels may include a light-emitting element that emits light. The light-emitting element may include, but is not limited to, at least one of: an organic light-emitting diode including an organic emissive layer, a quantum-dot light-emitting diode including a quantum-dot emissive layer, an inorganic light-emitting diode including an inorganic semiconductor, and a micro light-emitting diode (micro LED), or a combination thereof.

The non-display area NDA may be disposed adjacent to the display area DA. The non-display area NDA may be located on the outer side of the display area DA. The non-display area NDA may surround the display area DA. The non-display area NDA may be defined as the border of the display panel 100.

The non-display area NDA may include a gate driver, fan-out lines, and pads. The gate driver may supply gate signals to gate lines of the display area DA. The fan-out lines may electrically connect the display driver 200 with the data lines of the display area DA. The pads may be electrically connected to the data circuit board 500. For example, the pads may be disposed at one edge of the display panel 100, and the gate driver portion may be disposed at another edge adjacent to the edge of the display panel 100. It should be understood, however, that the disclosure is not limited thereto.

The display driver 200 may output signals and voltages for driving the display panel 100. The display driver 200 may supply data voltages to data lines. The display driver 200 may apply power voltage to voltage lines and may supply gate control signals to the gate driver. The display driver 200 may be implemented as an integrated circuit (IC) and mounted on the data circuit board 500 by the chip-on-film (COF) technique. As another example, the display driver 200 may be mounted in the non-display area NDA of the display panel 100 by chip-on-glass (COG) technique, chip-on-plastic (COP) technique, or ultrasonic bonding.

The timing controller 300 may be mounted on the control circuit board 600 and may receive digital video data and a timing synchronization signal supplied from a display driving system or a graphic device through a user connector provided on the control circuit board 600. The timing controller 300 may coordinate digital video data appropriately for the pixel arrangement structure in response to a timing synchronization signal, and may supply the coordinated digital video data to the display driver 200. The timing controller 300 may generate a data control signal and a gate control signal based on the timing synchronization signal. The timing controller 300 may control the timing of applying the data voltage of the display driver 200 based on the data control signal, and may control the timing of providing the gate signal of the gate driver based on the gate control signal.

The power supply part 400 may be mounted on the control circuit board 200 to apply a power voltage to the display panel 100 and the display driver 200. For example, the power supply part 400 may generate a driving voltage, a common voltage, an initialization voltage, or a reference voltage. The power supply part 400 may supply a power voltage to drive the pixels and the display driver 200.

The data circuit board 500 may be disposed on a pad disposed at one edge of the display panel 100. The data circuit board 500 may be attached to the pad using a conductive adhesive member such as an anisotropic conductive film. The data circuit board 500 may be electrically connected to signal lines of the display panel 100 through an anisotropic conductive film. The display panel 100 may receive data voltage and driving voltage through the data circuit board 500. For example, the data circuit board 500 may be a flexible printed circuit board (FPCB), a printed circuit board (PCB), or a flexible film such as a chip-on-film (COF).

The control circuit board 600 may be attached to the data circuit board 500 using a low-resistance, high-reliability material such as an anisotropic conductive film or a self-assembly anisotropic conductive paste (SAP). The control circuit board 600 may be electrically connected to the data circuit board 500. The control circuit board 600 may be a flexible printed circuit board or a printed circuit board.

Figure 2:
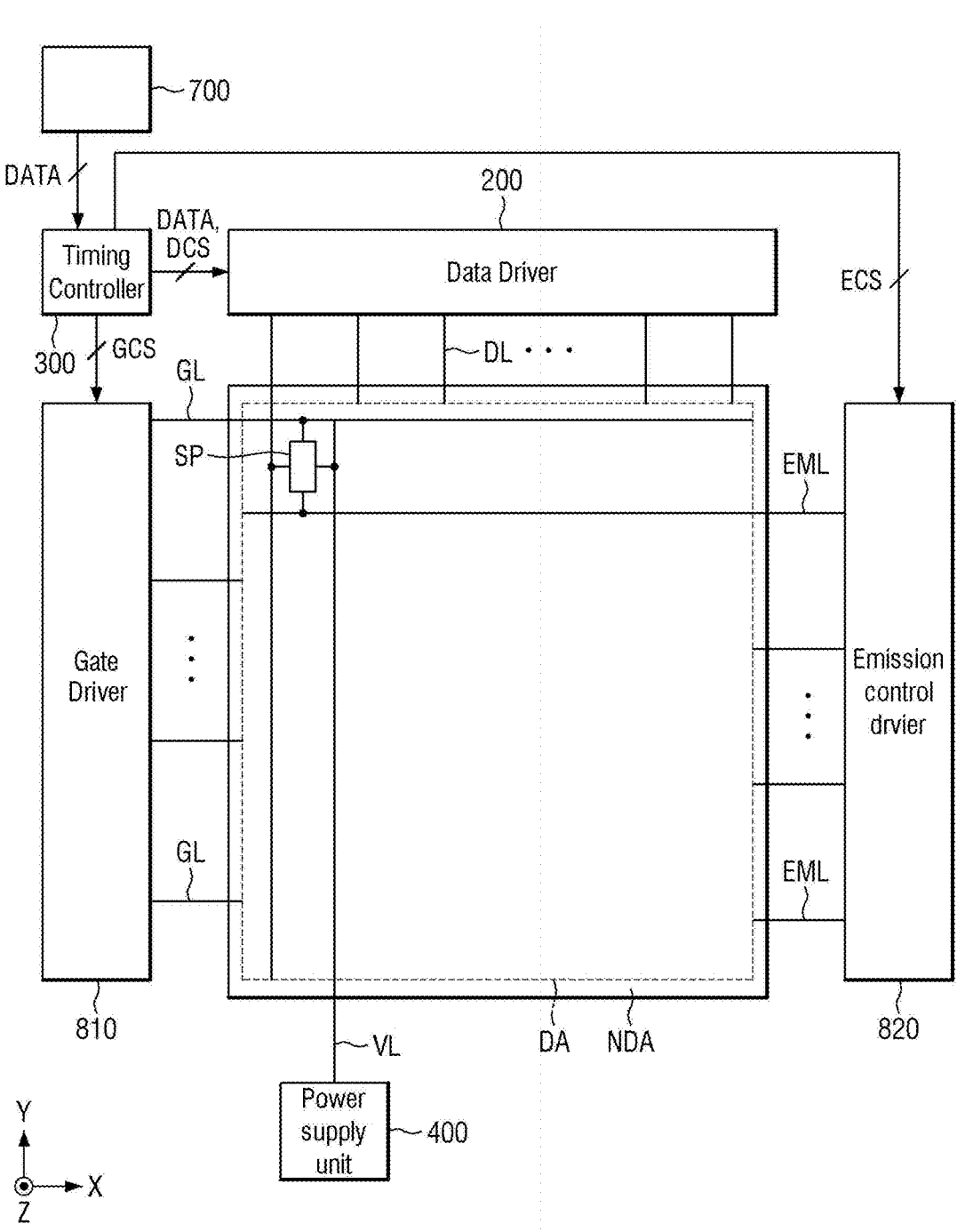
FIG. 2 is a block diagram showing a display device according to an embodiment of the disclosure.

FIG. 2 is a block diagram showing a display device according to an embodiment of the disclosure.

Referring to FIG. 2, a display panel 100 may include a display area DA and a non-display area NDA.

The display area DA may include pixels SP, voltage lines VL electrically connected to the pixels SP, gate lines GL, emission control lines EML, and data lines DL.

Each of the pixels SP may be electrically connected to a gate line GL, a data line DL, an emission control line EML, and a voltage line VL. Each of the pixels SP may include at least one transistor, a light-emitting element, and a capacitor.

The gate lines GL may be extended in the x-axis direction and may be spaced apart from one another in the y-axis direction crossing the x-axis direction. The gate lines GL may sequentially supply gate signals to the pixels SP.

The emission control lines EML may be extended in the x-axis direction and may be spaced apart from each other in the y-axis direction. The emission control lines EML may sequentially supply emission signals to the pixels SP.

The data lines DL may be extended in the y-axis direction and may be spaced apart from one another in the x-axis direction. The data lines DL may supply data voltages to the pixels SP. The data voltage may determine the luminance of each of the pixels SP.

The voltage lines VL may be extended in the y-axis direction and may be spaced apart from one another in the x-axis direction. The voltage lines VL may supply power voltage to the pixels SP. The power voltage may include at least one of a driving voltage, a common voltage, an initialization voltage, and a reference voltage, or a combination thereof. For example, the driving voltage may be a high-level voltage for driving the light-emitting elements of the pixels SP, and the common voltage may be a low-level voltage for driving the light-emitting elements of the pixels SP.

The display driver 200 may convert the digital video data DATA into analog data voltages and may supply them to the data lines DL through the fan-out lines. A gate signal from the gate driver 810 may be used to select a pixel SP to which a data voltage is applied, and the selected sub-pixel SP may receive a data voltage through the data line DL.

The timing controller 300 may receive digital video data DATA and timing signals from a graphic device 700. For example, the graphics device 700 may be, but is not limited to, a graphics card of the display device 10. The timing controller 300 may control the operation timing of the display driver 200 by generating a data control signal DCS based on the timing signals to supply it to the display driver 200. The timing controller 300 may supply digital video data DATA to the display driver 200. The timing controller 300 may control the operation timing of the gate driver 810 by generating a gate control signal GCS based on the timing signal to supply it to the gate driver 810. The timing controller 300 may control the operation timing of an emission control driver 820 by generating an emission control signal ECS based on the timing signal to supply it to the emission control driver 820.

The power supply part 400 may be disposed on the data circuit board 500 to provide a power voltage to the display driver 200 and the display panel 100. The power supply part 400 may generate a driving voltage to supply it to a driving voltage line, may generate an initialization voltage to supply it to an initialization voltage line, may generate a reference voltage to supply it to a reference voltage line, and may generate a common voltage to supply it to a common electrode shared by the light-emitting elements of the pixels.

The gate driver 810 may be disposed on one outer side of the display area DA or on one outer side of the non-display area NDA, and the emission control driver 820 may be disposed on the opposite outer side of the display area DA or on the opposite outer side of the non-display area NDA. It should be understood, however, that the disclosure is not limited thereto. For another example, the gate driver 810 and the emission control driver 820 may be disposed on one side or the opposite side of the non-display area NDA.

The gate driver 810 may include thin-film transistors for generating gate signals based on the gate control signal GCS. The emission control driver 820 may include thin-film transistors for generating emission signals based on the emission control signal ECS. For example, the transistors of the gate driver 810, the transistors of the emission control driver 820, and the transistors of each of the pixels SP may be disposed on a same layer. The gate driver 810 may provide gate signals to the gate lines GL, and the emission control driver 820 may provide emission signals to the emission control lines EML.

Figure 3:
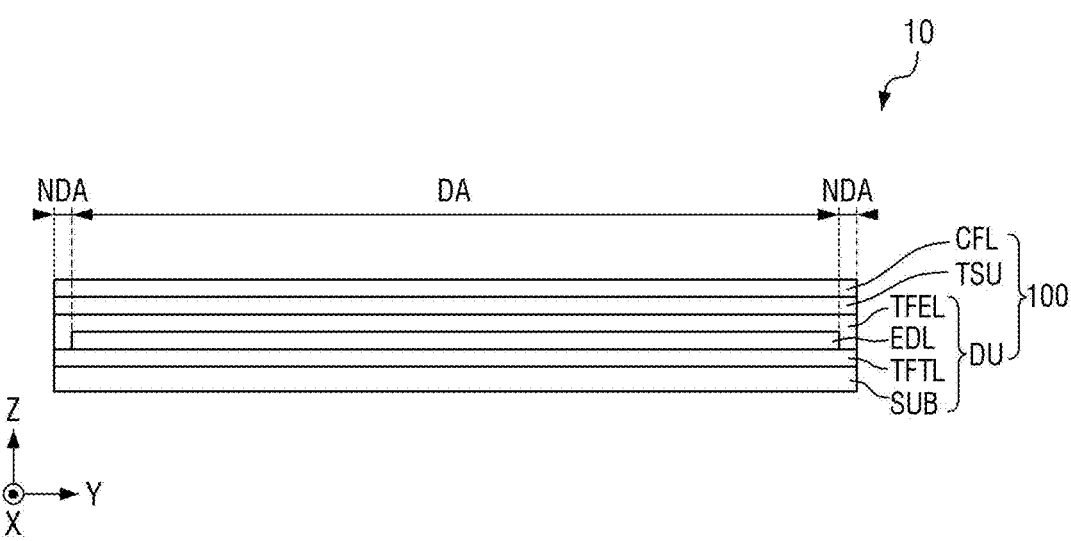
FIG. 3 is a schematic cross-sectional view showing a display device according to an embodiment of the disclosure.

FIG. 3 is a schematic cross-sectional view showing a display device according to an embodiment of the disclosure.

Referring to FIG. 3, the display panel 100 may include a display unit DU, a touch sensing unit TSU, or a combination thereof, and a color filter layer CFL. The display unit DU may include a substrate SUB, a thin-film transistor layer TFTL, an emission layer EDL and an encapsulation layer TFEL.

The substrate SUB may be a base substrate or a base member. The substrate SUB may be a flexible substrate that can be bent, folded, or rolled. For example, the substrate SUB may include, but is not limited to, a polymer resin such as polyimide (PI). For another example, the substrate SUB may include a glass material or a metal material, or a combination thereof.

The thin-film transistor layer TFTL may be disposed on the substrate SUB. The thin-film transistor layer TFTL may include thin-film transistors forming pixel circuits of pixels. The thin-film transistor layer TFTL may further include gate lines, data lines, voltage lines, gate control lines, fan-out lines for connecting the display driver 200 with the data lines, or a combination thereof. Each of the thin-film transistors may include a semiconductor region, a source electrode, a drain electrode, and a gate electrode. For example, in case that the gate driver is formed on one side of the non-display area NDA of the display panel 100, the gate driver may include thin-film transistors.

The thin-film transistor layer TFTL may be disposed in the display area DA and the non-display area NDA. The thin-film transistors in each of the pixels, the gate lines, the data lines and the voltage lines in the thin-film transistor layer TFTL may be disposed in the display area DA. The gate control lines and the fan-out lines in the thin-film transistor layer TFTL may be disposed in the non-display area NDA.

The emission layer EDL may be disposed on the thin-film transistor layer TFTL. The emission layer EDL may include light-emitting elements in each of which a pixel electrode, an emissive layer and a common electrode may be stacked each other (for example, stacked sequentially) to emit light, and a pixel-defining film for defining the pixels. The light-emitting elements in the emission layer EDL may be disposed in the display area DA.

For example, the emissive layer may be an organic light-emitting layer containing an organic material. The emissive layer may include a hole transporting layer, an organic light-emitting layer and an electron transporting layer. In case that the pixel electrode receives a voltage and the common electrode receives a cathode voltage through the thin-film transistors in the thin-film transistor layer TFTL, the holes and electrons may move to the organic light-emitting layer through the hole transporting layer and the electron transporting layer, respectively, such that they combine in the organic light-emitting layer to emit light. For example, the pixel electrode may be an anode electrode while the common electrode may be a cathode electrode. It is, however, to be understood that the disclosure is not limited thereto.

As another example, the light-emitting elements may include quantum-dot light-emitting diodes each including a quantum-dot emissive layer, inorganic light-emitting diodes each including an inorganic semiconductor, or micro light-emitting diodes, or a combination thereof.

The encapsulation layer TFEL may cover the upper and side surfaces of the emission layer EDL, and may protect the emission layer EDL. The encapsulation layer TFEL may include at least one inorganic layer and at least one organic layer for encapsulating the emission layer EDL.

The touch sensing unit TSU may be disposed on the encapsulation layer TFEL. The touch sensing unit TSU may include touch electrodes for sensing a user's touch by capacitive sensing, and touch lines electrically connecting the touch electrodes with a touch driver. For example, the touch sensing unit TSU may sense a user's touch by mutual capacitance sensing or self-capacitance sensing.

For another example, the touch sensing unit TSU may be disposed on a separate substrate disposed on the display unit DU. In such case, the substrate supporting the touch sensing unit TSU may be a base member encapsulating the display unit DU.

The touch electrodes of the touch sensing unit TSU may be disposed in a touch sensor area overlapping the display area DA. The touch lines of the touch sensing unit TSU may be disposed in a touch peripheral area overlapping the non-display area NDA.

The color filter layer CFL may be disposed on the touch sensing unit TSU. The color filter layer CFL may include color filters associated with the emission areas, respectively. Each of the color filters may selectively transmit light of a particular wavelength and block or absorb lights of other wavelengths. The color filter layer CFL may absorb some of lights introduced from the outside of the display device 10 to reduce the reflection of external light. Accordingly, the color filter layer CFL may prevent distortion of colors due to the reflection of external light.

Since the color filter layer CFL may be disposed directly on and contact (e.g., directly contact) the touch sensing unit TSU, the display device 10 may require no separate substrate for the color filter layer CFL. Therefore, the thickness of the display device 10 may be relatively reduced.

Figure 4:
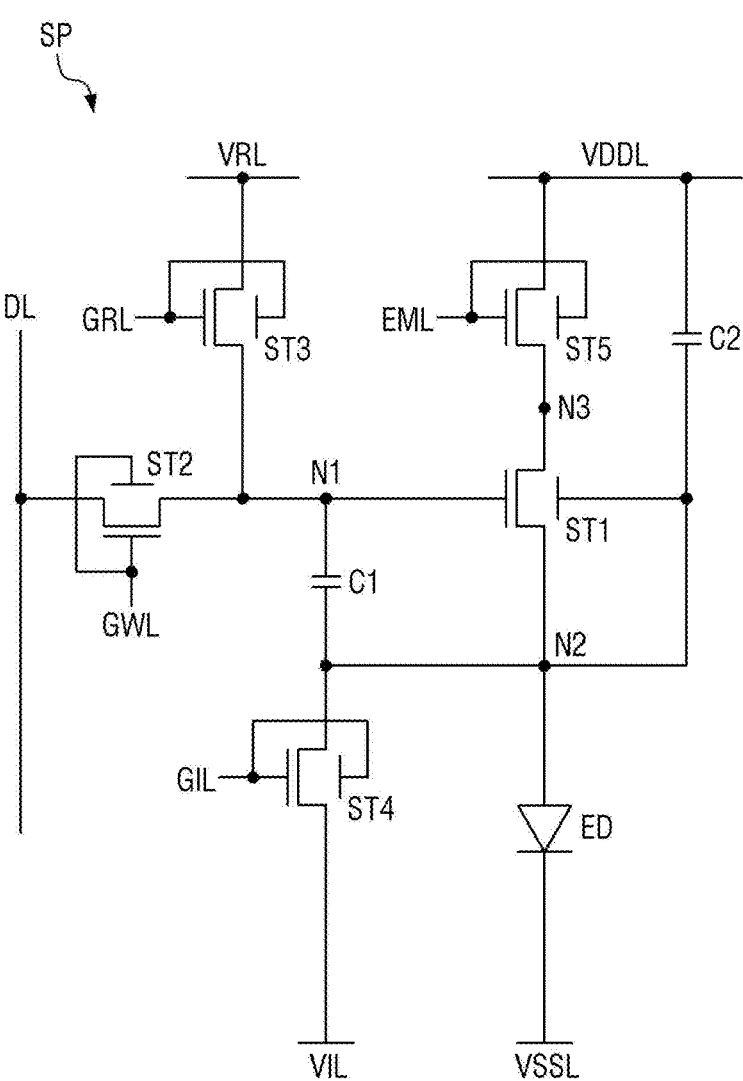
FIG. 4 is a schematic diagram of an equivalent circuit of a pixel of a display device according to an embodiment of the disclosure.
Figure 5:
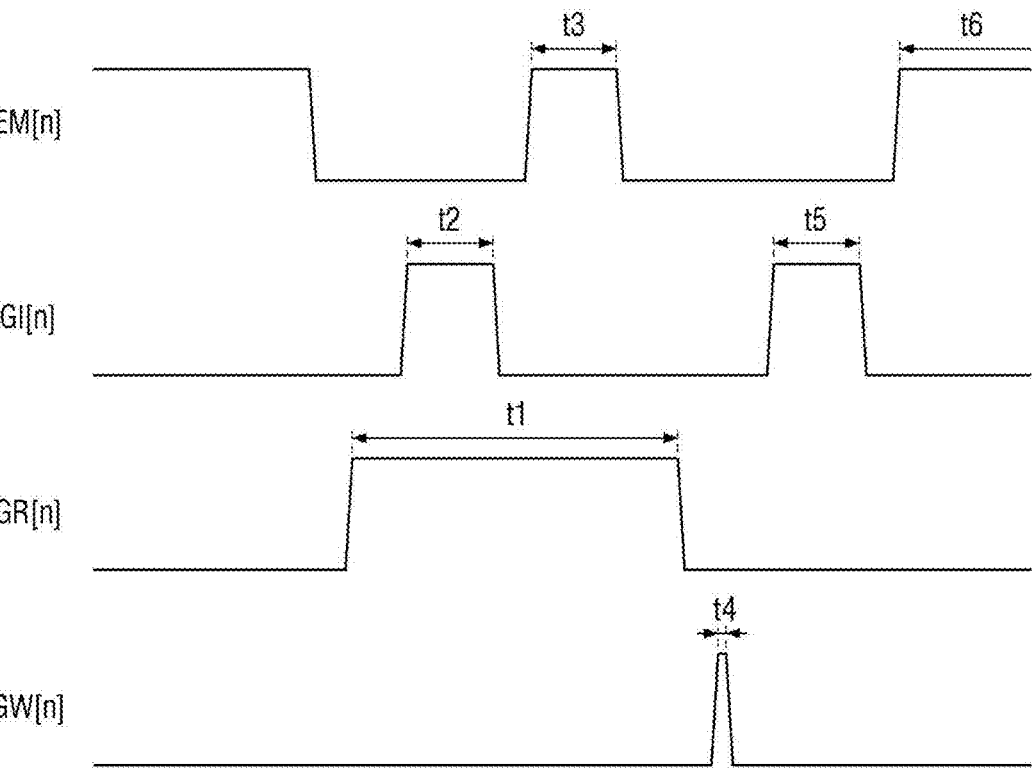
FIG. 5 is a waveform diagram of signals supplied to the pixel shown in FIG. 4.

FIG. 4 is a schematic diagram of an equivalent circuit of a pixel of a display device according to an embodiment of the disclosure. FIG. 5 is a waveform diagram of signals supplied to the pixel shown in FIG. 4.

Referring to FIGS. 4 and 5, the display panel 100 may include pixels SP arranged along p rows and q columns, where p and q are positive integers. Each of the pixels SP may be electrically connected to a first gate line GWL, a second gate line GRL, a third gate line GIL, an emission control line EML, a data line DL, a reference voltage line VRL, a driving voltage line VDDL, an initialization voltage line VIL, and a low-level voltage line VSSL.

Each of the pixels SP may include a pixel circuit and a light-emitting element ED. The pixel circuit may include a first transistor ST1, a second transistor ST2, a third transistor ST3, a fourth transistor ST4, a fifth transistor ST5, a first capacitor C1, and a second capacitor C2.

The first transistor ST1 may include a gate electrode, a source electrode, and a drain electrode. The first transistor ST1 may control a drain-source current (Ids) (or a driving current) based on a data voltage applied to the gate electrode. The driving current (Ids) flowing through the channel of the first transistor ST1 may be proportional to the square of the difference between the threshold voltage (Vth) and the voltage (Vgs) between the gate electrode and the source electrode of the first transistor ST1 $(Ids=k'\times(Vgs-Vth)^2)$, where "k" denotes a proportional coefficient determined by the structure and physical properties of the first transistor ST1, "Vgs" denotes the gate-source voltage of the first transistor ST1, and "Vth" denotes the threshold voltage of the first transistor ST1. The gate electrode of the first transistor ST1 may be electrically connected to the first node N1, the drain electrode of the first transistor ST1 may be electrically connected to the third node N3, and the source electrode of the first transistor ST1 may be electrically connected to the second node N2. The first transistor ST1 may further include a bias electrode electrically connected to the second node N2.

The light-emitting element ED may receive the driving current (Ids) to emit light. The amount or the luminance of the light emitted from the light-emitting element ED may be proportional to the magnitude of the driving current (Ids).

The light-emitting element ED may be an organic light-emitting diode including a first electrode, a second electrode, and an organic light-emitting layer disposed between the first electrode and the second electrode. As another example, the light-emitting element ED may be an inorganic light-emitting element including a first electrode, a second electrode, and an inorganic semiconductor disposed between the first electrode and the second electrode. As another example, the light-emitting element ED may be a quantum-dot light-emitting element including a first electrode, a second electrode, and a quantum-dot emissive layer between the first electrode and the second electrode. As another example, the light-emitting element ED may be a micro light-emitting diode.

The first electrode of the light-emitting element ED may be electrically connected to the second node N2. The first electrode of the light-emitting element ED may be electrically connected to the source electrode of the first transistor ST1, a drain electrode of the fourth transistor ST4, a second electrode of the first capacitor C1, and a second electrode of the second capacitor C2 through the second node N2. The second electrode of the light-emitting element ED may be electrically connected to the low-level voltage line VSSL and may receive a low-level voltage from the low-level voltage line VSSL.

The second transistor ST2 may be turned on by a first gate signal GW[n] of the first gate line GWL to electrically connect the data line DL with the first node N1, which is the gate electrode of the first transistor ST1. The second transistor ST2 may be turned on in response to the first gate signal GW[n] to apply data voltage to the first node N1. The gate electrode of the second transistor ST2 may be electrically connected to the first gate line GWL, the drain electrode thereof may be electrically connected to the data line DL, and the source electrode thereof may be electrically connected to the first node N1. The second transistor ST2 may further include a bias electrode electrically connected to the first gate line GWL.

The third transistor ST3 may be turned on by the second gate signal GR[n] of the second gate line GRL to electrically connect the reference voltage line VRL with the first node N1 which is the gate electrode of the first transistor ST1. The third transistor ST3 may be turned on in response to the second gate signal GR[n] to apply the reference voltage to the first node N1. A gate electrode of the third transistor ST3 may be electrically connected to the second gate line GRL, the drain electrode may be electrically connected to the voltage line VRL, and the source electrode may be electrically connected to the first node N1. The third transistor ST3 may further include a bias electrode electrically connected to the second gate line GRL.

The fourth transistor ST4 may be turned on by a third gate signal GI[n] of the third gate line GIL to electrically connect the second node N2 which is the source electrode of the first transistor ST1 with the initialization voltage line VIL. As the fourth transistor ST4 is turned on based on the third gate signal GI[n], the first electrode of the light-emitting element ED may be discharged to the initialization voltage. The gate electrode of the fourth transistor ST4 may be electrically connected to the third gate line GIL, the drain electrode thereof may be electrically connected to the second node N2, and the source electrode thereof may be electrically connected to the initialization voltage line VIL. The fourth transistor ST4 may further include a bias electrode electrically connected to the third gate line GIL.

The fifth transistor ST5 may be turned on by an emission signal EM[n] of the emission control line EML and may electrically connect the driving voltage line VDDL with the drain electrode of the first transistor ST1. A gate electrode of the fifth transistor T5 may be electrically connected to the emission line EML, the drain electrode thereof may be electrically connected to the driving voltage line VDDL, and the source electrode thereof may be electrically connected to the third node N3. In case that all of the fifth transistor ST5 and the first transistor ST1 are turned on, the driving current may be supplied to the light-emitting element ED. The fifth transistor ST5 may further include a bias electrode electrically connected to the emission control line EML.

Figure 7:
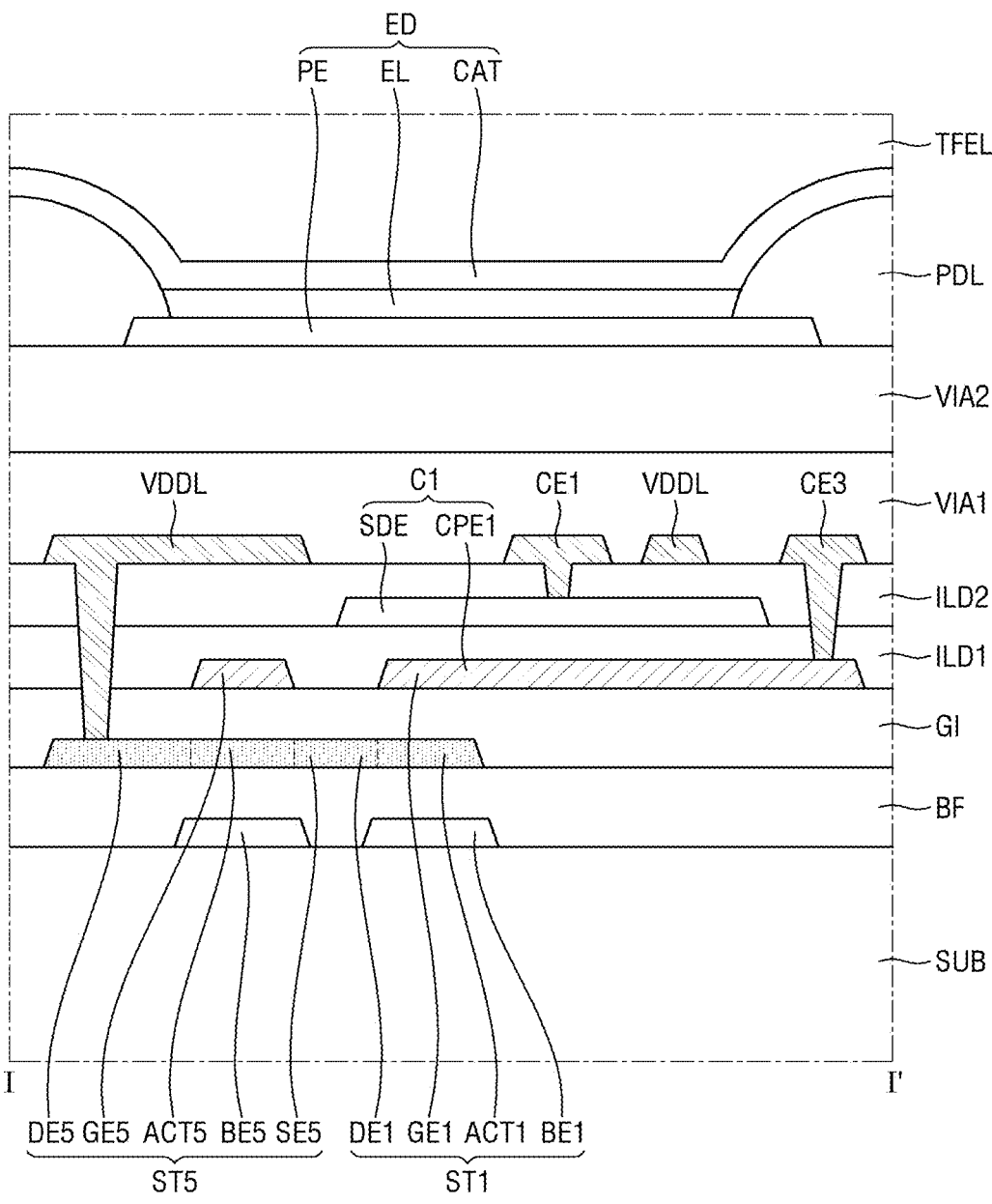
FIG. 7 is a schematic cross-sectional view showing an example, taken along line I-I' of FIG. 6.

Each of the first transistor ST1, the second transistor ST2, the third transistor ST3, the fourth transistor ST4 and the fifth transistor ST5 may include an oxide-based active layer (ACTL of FIG. 7). The first to fifth transistors ST1, ST2, ST3, ST4 and ST5 may have a coplanar structure in which a gate electrode may be disposed at the top. The first to fifth transistors ST1, ST2, ST3, ST4 and ST5 may be n-type transistors and may output electric current introduced into the drain electrode via the source electrode based on a gate-high voltage applied to the gate electrode. The oxide-based active layer ACTL may have a relatively small s-factor, may increase the constant driving current at the low gray-levels, and may improve low gray-level expression.

For another example, at least one of the first transistor ST1, the second transistor ST2, the third transistor ST3, the fourth transistor ST4 and the fifth transistor ST5 may include an active layer ACTL made of low-temperature polycrystalline silicon (LTPS). The first to fifth transistors ST1, ST2, ST3, ST4 and ST5 may be p-type transistors and may output electric current introduced into the source electrode via the drain electrode based on a gate-low voltage applied to the gate electrode.

The first capacitor C1 may be electrically connected between the first node N1, which is the gate electrode of the first transistor ST1, and the second node N2, which is the source electrode of the first transistor ST1. For example, the first capacitor C1 may comprise a first capacitor electrode CPE1 that may be electrically connected to the first node N1. The first capacitor C1 also may comprise a corresponding second electrode that may be electrically connected to the second node N2, so that a potential difference between the gate electrode GE1 and the source electrode SE1 of the first transistor ST1 may be maintained.

The second capacitor C2 may be electrically connected between the driving voltage line VDDL and the second node N2, which is the source electrode of the first transistor ST1. For example, the second capacitor C2 may comprise a second capacitor electrode CPE2 that may be electrically connected to the driving voltage line VDDL. The second capacitor C2 also may comprise a corresponding second electrode that may be electrically connected to the second node N2, so that a potential difference between the driving voltage line VDDL and the source electrode SE1 of the first transistor ST1 may be maintained.

Referring to FIG. 5 in conjunction with FIG. 4, the display device 10 may be driven at a selectable driving frequency. One frame may include first to sixth time periods t1 to t6.

The third transistor ST3 may receive the high-level second gate signal GR[n] during a first time period t1. The third transistor ST3 may be turned on based on the second gate signal GR[n] at the high level to apply a reference voltage to the first node N1, which is the gate electrode of the first transistor ST1.

The fourth transistor ST4 may receive the high-level third gate signal GI[n] during second and fifth time periods t2 and t5. The fourth transistor ST4 may be turned on based on the third gate signal GI[n] at the high level and may discharge the second node N2 that is the source electrode of the first transistor ST1 to the initialization voltage.

The fifth transistor ST5 may receive the high-level emission signal EM[n] during the third and sixth time periods t3 and t6. The fifth transistor ST5 may be turned on based on the emission signal EM[n] at the high level to apply a driving voltage to the third node N3, which is the drain electrode of the first transistor ST1. The fifth transistor ST5 may compensate for the voltage of the third node N3 by applying a driving voltage during the third time period t3, and may supply a driving current to the light-emitting element ED by applying a driving voltage during the sixth time period t6.

The second transistor ST2 may receive the first gate signal GW[n] at the high level during the fourth time period t4. The second transistor ST2 may be turned on based on the first gate signal GW[n] at the high level to apply data voltage to the first node N1, which is the gate electrode of the first transistor ST1.

In case that the gate electrode of the first transistor ST1 receives the data voltage (Vdata), the source-gate voltage Vsg of the first transistor ST1 may be equal to the difference voltage (Vdata−Vin) between the data voltage (Vdata) and the initialization voltage (Vin), and the gate-source voltage (Vgs) becomes greater than the threshold voltage (Vth) (Vdata−Vin>=Vth) and thus the first transistor ST1 may be turned on. Therefore, the drain-source current (Ids) of the first transistor ST1 may be determined based on the data voltage (Vdata), the initialization voltage (Vin) and the threshold voltage (Vth) of the first transistor ST1 (Ids=k× (Vdata−Vin−Vth)$^2$). The first transistor ST1 may supply the drain-source current (Ids) to the second node N2 until the gate-source voltage (Vgs) reaches the threshold voltage (Vth) of the first transistor ST1. In this manner, while the first transistor ST1 is turned on, the voltage at the second node N2 and the drain-source current (Ids) of the first transistor ST1 may be changed, and the voltage at the second node N2 may eventually converge to the difference voltage (Vdata-Vth) between the data voltage (Vdata) and the threshold voltage (Vth) of the first transistor ST1.

Figure 6:
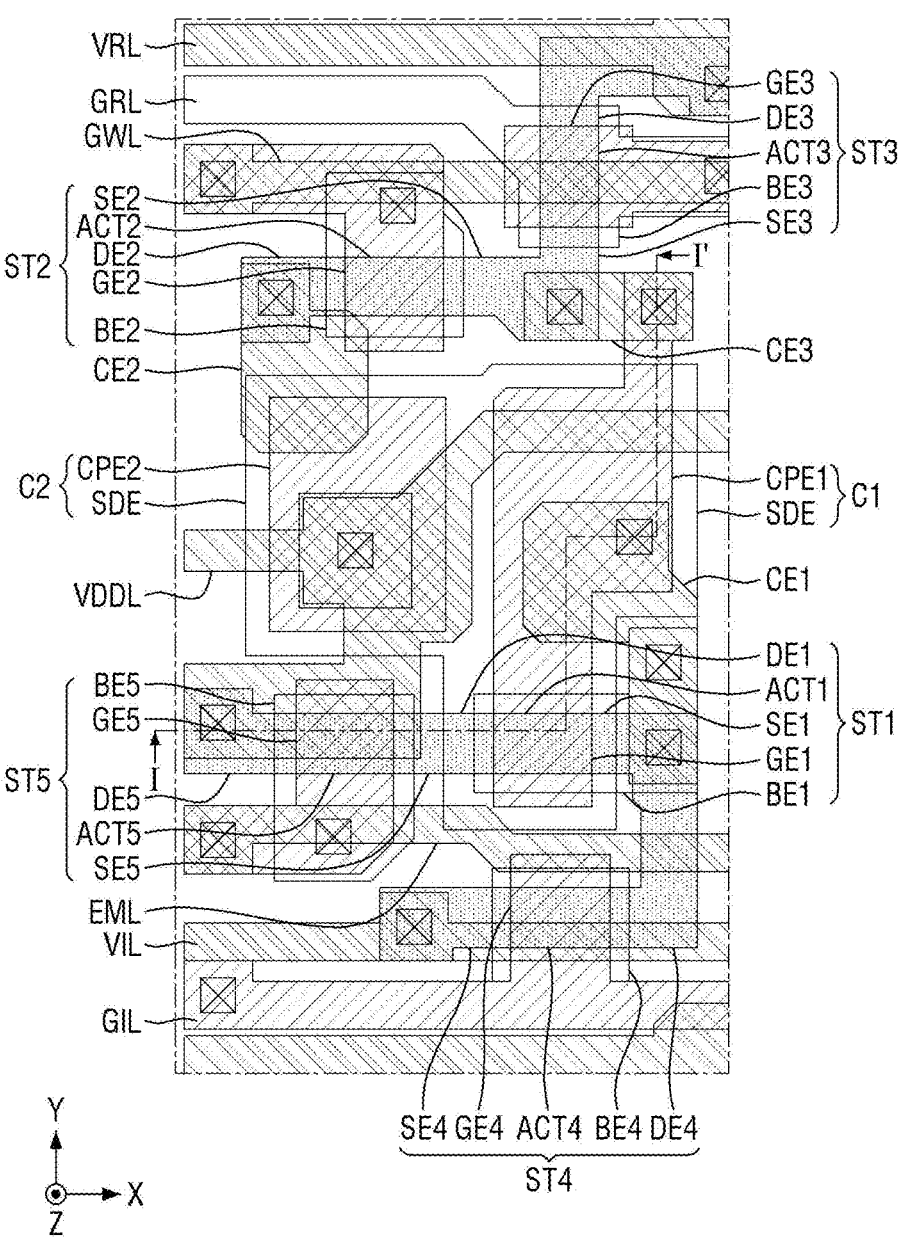
FIG. 6 is a view showing a layout of a pixel of a display device according to an embodiment of the disclosure.

FIG. 6 is a view showing a layout of a pixel of a display device according to an embodiment of the disclosure. FIG. 7 is a schematic cross-sectional view showing an example, taken along line I-I' of FIG. 6.

Referring to FIG. 6, the display area DA may include a pixel SP, an initialization voltage line VIL, a reference voltage line VRL, a driving voltage line VDDL, a first gate line GWL, a second gate line GRL, a third gate line GIL, and an emission control line EML.

The first gate line GWL may be disposed on a fourth metal layer MTL4 and may be extended in the first direction (x-axis direction). The first gate line GWL may be disposed on the upper side of the first and second capacitors C1 and C2. In the following description, the "right side" refers to the direction indicated by the arrow of the x-axis, the "left side" refers to the direction opposite to the direction indicated by the arrow of the x-axis, the "upper side" refers to the direction indicated by the arrow of the y-axis, and the "lower side" refers to the direction opposite to the direction indicated by the arrow of the y-axis. The first gate line GWL may be electrically connected to a gate electrode GE2 of the second transistor ST2 disposed on a second metal layer (MTL2 of FIG. 7), and the gate electrode GE2 of the second transistor ST2 may be electrically connected to a bias electrode BE2 disposed on a first metal layer (MTL1 of FIG. 7).

The second gate line GRL may be disposed on the first metal layer MTL1 and may be extended in the first direction (x-axis direction). The second gate line GRL may be disposed on the upper side of the first gate line GWL. The second gate line GRL may be electrically connected to the gate electrode GE3 of the third transistor ST3 disposed on the second metal layer MTL2. The second gate line GRL may include a bias electrode BE3 of the third transistor ST3.

The third gate line GIL may be disposed on the first metal layer MTL1 and may be extended in the first direction (x-axis direction). The third gate line GIL may be disposed on the lower side of the initialization voltage line VIL. The third gate line GIL may be electrically connected to the gate electrode GE4 of the fourth transistor ST4 disposed on the second metal layer MTL2. The third gate line GIL may include a bias electrode BE4 of the fourth transistor ST4 overlapping the gate electrode GE4 of the fourth transistor ST4.

The emission control line EML may be disposed on the fourth metal layer MTL4 and may be extended in the first direction (x-axis direction). The emission control line EML may be disposed on the upper side of the initialization voltage line VIL. The emission control line EML may be disposed on the lower side of the first and second capacitors C1 and C2. The emission control line EML may be electrically connected to a gate electrode GE5 of the fifth transistor ST5 disposed on the second metal layer MTL2, and the gate electrode GE5 of the fifth transistor ST5 may be electrically connected to a bias electrode BE5 disposed on the first metal layer MTL1.

The reference voltage line VRL may be disposed on the fourth metal layer MTL4 and may be extended in the first direction (x-axis direction). The reference voltage line VRL may be disposed on the upper side of the second gate line GRL. The reference voltage line VRL may be electrically connected to the drain electrode DE3 of the third transistor ST3 to apply a reference voltage.

The driving voltage line VDDL may be disposed on the fourth metal layer MTL4 and may be extended in the first direction (x-axis direction). The driving voltage line VDDL may overlap the first and second capacitors C1 and C2. The driving voltage line VDDL may be electrically connected to the drain electrode DE5 of the fifth transistor ST5 to apply a driving voltage. The driving voltage line VDDL may be electrically connected to a second capacitor electrode CPE2 to apply a driving voltage.

The initialization voltage line VIL may be disposed on the fourth metal layer MTL4 and may be extended in the first direction (x-axis direction). The initialization voltage line VIL may be disposed between the third gate line GIL and the emission control line EML. The initialization voltage line VIL may be electrically connected to the source electrode SE4 of the fourth transistor ST4 to apply an initialization voltage.

The first transistor ST1 may include a semiconductor region ACT1, a gate electrode GE1, a drain electrode DE1, a source electrode SE1, and a bias electrode BE1. As illustrated in FIG. 6, the drain electrode DE1 may be disposed on a first side of the semiconductor region ACT1, and the source electrode SE1 may be disposed on a second side opposite to the first side of the semiconductor region ACT1 in a plan view. The semiconductor region ACT1 of the first transistor ST1 may be disposed in the active layer ACTL, and may overlap the gate electrode GE1 of the first transistor ST1. The active layer ACTL may be disposed on the buffer layer BF covering the first metal layer MTL1.

The gate electrode GE1 of the first transistor ST1 may be disposed in the second metal layer MTL2. The gate electrode GE1 of the first transistor ST1 and a first capacitor electrode CPE1 of a first capacitor C1 may be integral with each other in the second metal layer MTL2. The gate electrode GE1 of the first transistor ST1 and the first capacitor electrode CPE1 may be electrically connected to the source electrode SE2 of the second transistor ST2 and the source electrode SE3 of the third transistor ST3 through a third connection electrode CE3 of the fourth metal layer MTL4.

The drain electrode DE1 and the source electrode SE1 of the first transistor ST1 may be formed into a conductor by heat-treating the active layer ACTL. The drain electrode DE1 and the source electrode SE1 may be made conductive as an n-type semiconductor, but the disclosure is not limited thereto. The drain electrode DE1 of the first transistor ST1 and the source electrode SE5 of the fifth transistor ST5 may be integral with each other. The source electrode SE1 of the first transistor ST1 may be electrically connected to a shielding electrode SDE through a first connection electrode CE1 of the fourth metal layer MTL4. The source electrode SE1 of the first transistor ST1 and the drain electrode DE4 of the fourth transistor ST4 may be integral with each other.

The bias electrode BE1 of the first transistor ST1 may be disposed in the first metal layer MTL1 and overlap the semiconductor region ACT1 and the gate electrode GE1 of the first transistor ST1. The bias electrode BE1 of the first transistor ST1 may be electrically connected to the shielding electrode SDE through the first connection electrode CE1.

The second transistor ST2 may include a semiconductor region ACT2, a gate electrode GE2, a drain electrode DE2, a source electrode SE2, and a bias electrode BE2. The active area ACT2 of the second transistor ST2 may be disposed in the active layer ACTL, and may overlap the gate electrode GE2 of the second transistor ST2. The gate electrode GE2 of the second transistor ST2 may be disposed in the second metal layer MTL2. The gate electrode GE2 of the second transistor ST2 may be electrically connected to the first gate line GWL and the bias electrode BE2.

The drain electrode DE2 and the source electrode SE2 of the second transistor ST2 may be formed into a conductor by heat-treating the active layer ACTL. The drain electrode DE2 of the second transistor ST2 may be electrically connected to the data line DL (see FIG. 4) through the second connection electrode CE2 of the fourth metal layer MTL4. The drain electrode DE2 of the second transistor ST2 may receive a data voltage of the pixel SP from the data line DL. The data line DL is not shown in FIGS. 6 and 7 and may be disposed on the fourth metal layer MTL4, but the stack structure of the data line DL is not limited thereto. The source electrode SE2 of the second transistor ST2 may be electrically connected to the gate electrode GE1 of the first transistor ST1 and the first capacitor electrode CPE1 through the third connection electrode CE3. The source electrode SE2 of the second transistor ST2 and the source electrode SE3 of the third transistor ST3 may be integral with each other.

The bias electrode BE2 of the second transistor ST2 may be disposed in the first metal layer MTL1 and overlap the semiconductor region ACT2 and the gate electrode GE2 of the second transistor ST2. The bias electrode BE2 of the second transistor ST2 may be electrically connected to the gate electrode GE2 of the second transistor ST2.

The third transistor ST3 may include a semiconductor region ACT3, a gate electrode GE3, a drain electrode DE3, a source electrode SE3, and a bias electrode BE3. The semiconductor region ACT3 of the third transistor ST3 may be disposed in the active layer ACTL, and may overlap the gate electrode GE3 of the third transistor ST3. The gate electrode GE3 of the third transistor ST3 may be disposed in the second metal layer MTL2. The gate electrode GE3 of the third transistor ST3 may be electrically connected to the second gate line GRL.

The drain electrode DE3 and the source electrode SE3 of the third transistor ST3 may be formed into a conductor by heat-treating the active layer ACTL. The drain electrode DE3 of the third transistor ST3 may be electrically connected to the reference voltage line VRL to receive the reference voltage. The source electrode SE3 of the third transistor ST3 may be electrically connected to the gate electrode GE1 of the first transistor ST1 and the first capacitor electrode CPE1 through the third connection electrode CE3. The source electrode SE3 of the third transistor ST3 and the source electrode SE2 of the second transistor ST2 may be integral with each other.

The bias electrode BE3 of the third transistor ST3 may be disposed in the first metal layer MTL1 and overlap the semiconductor region ACT3 and the gate electrode GE3 of the third transistor ST3. The bias electrode BE3 of the third transistor ST3 may be a part of the second gate line GRL. The bias electrode BE3 of the third transistor ST3 may be electrically connected to the gate electrode GE3 of the third transistor ST3.

The fourth transistor ST4 may include a semiconductor region ACT4, a gate electrode GE4, a drain electrode DE4, a source electrode SE4, and a bias electrode BE4. The semiconductor region ACT4 of the fourth transistor ST4 may be disposed in the active layer ACTL, and may overlap the gate electrode GE4 of the fourth transistor ST4. The gate electrode GE4 of the fourth transistor ST4 may be disposed in the second metal layer MTL2. The gate electrode GE4 of the fourth transistor ST4 may be electrically connected to the third gate line GIL.

The drain electrode DE4 and the source electrode SE4 of the fourth transistor ST4 may be formed into a conductor by heat-treating the active layer ACTL. The drain electrode DE4 of the fourth transistor ST4 may be electrically connected to the shielding electrode SDE through the first connection electrode CE1. The drain electrode DE4 of the fourth transistor ST4 and the source electrode SE1 of the first transistor ST1 may be integral with each other. The source electrode SE4 of the fourth transistor ST4 may be electrically connected to the initialization voltage line VIL.

The bias electrode BE4 of the fourth transistor ST4 may be disposed in the first metal layer MTL1 and overlap the semiconductor region ACT4 and the gate electrode GE4 of the fourth transistor ST4. The bias electrode BE4 of the fourth transistor ST4 may be a part of the third gate line GIL. The bias electrode BE4 of the fourth transistor ST4 may be electrically connected to the gate electrode GE4 of the fourth transistor ST4.

The fifth transistor ST5 may include a semiconductor region ACT5, a gate electrode GE5, a drain electrode DE5, a source electrode SE5, and a bias electrode BE5. The semiconductor region ACT5 of the fifth transistor ST5 may be disposed in the active layer ACTL, and may overlap the gate electrode GE5 of the fifth transistor ST5. The gate electrode GE5 of the fifth transistor ST5 may be disposed in the second metal layer MTL2. The gate electrode GE5 of the fifth transistor ST5 may be electrically connected to the emission control line EML.

The drain electrode DE5 and the source electrode SE5 of the fifth transistor ST5 may be formed into a conductor by performing heat treatment on the active layer ACTL. The drain electrode DE5 of the fifth transistor may be electrically connected to the driving voltage line VDDL to receive a driving voltage. The source electrode SE5 of the fifth transistor ST5 and the drain electrode DE1 of the first transistor ST1 may be integral with each other.

The first capacitor C1 may be formed between the first capacitor electrode CPE1 and the shielding electrode SDE. The first capacitor electrode CPE1 may be disposed in the second metal layer MTL2, and the shielding electrode SDE may be disposed in the third metal layer MTL3. The first capacitor electrode CPE1 may be the first electrode of the first capacitor C1 and may be electrically connected to the first node N1 of FIG. 4. The shielding electrode SDE may correspond to a second electrode of the first capacitor C1 and be electrically connected to the second node N2 of FIG. 4. Accordingly, the first capacitor C1 may maintain the potential difference between the first and second nodes N1 and N2. The first capacitor C1 may be disposed on the right side of the second capacitor C2, but the positions of the first and second capacitors C1 and C2 may be switched.

The second capacitor C2 may be formed between the second capacitor electrode CPE2 and the shielding electrode SDE. The second capacitor electrode CPE2 may be disposed in the second metal layer MTL2, and the shielding electrode SDE may be disposed in the third metal layer MTL3. The second capacitor electrode CPE2 may be the first electrode of the second capacitor C2 and may be electrically connected to the driving voltage line VDDL. The shielding electrode SDE may be the second electrode of the second capacitor C2 and may be electrically connected to the second node N2 of FIG. 4. Accordingly, the second capacitor C2 may maintain the potential difference between the driving voltage line VDDL and the second node N2. The second capacitor C2 may be disposed on the left side of the first capacitor C1, but the positions of the first and second capacitors C1 and C2 may be switched.

The shielding electrode SDE may be electrically connected to the first electrode of the light-emitting element ED. The shielding electrode SDE may cover the upper surface of the drain electrode DE1 of the first transistor ST1. The shielding electrode SDE may prevent the voltage of the drain electrode DE1 of the first transistor ST1 from being electrically connected to a voltage line or signal line disposed on the third metal layer MTL3. Accordingly, the shielding electrode SDE may prevent compensation errors in the first transistor ST1 and may improve the image quality of the display device 10.

The first gate line GWL and the second gate line GRL may be spaced apart from the first transistor ST1 with the first and second capacitors C1 and C2 therebetween. The third gate line GIL may be spaced apart from the first transistor ST1 with the emission control line EML therebetween. Accordingly, the first to third gate lines GWL, GRL and GIL may be spaced apart from the drain electrode DE1 of the first transistor ST1, and may prevent the voltage of the drain electrode DE1 of the first transistor ST1 from being electrically connected to a rising pulse or falling pulse of the first to third gate signals GW[n], GR[n] and GI[n].

In FIG. 7, the display panel 100 may include a substrate SUB, a first metal layer MTL1, a buffer layer BF, an active layer ACTL, a gate insulator GI, a second metal layer MTL2, a first interlayer dielectric layer ILD1, a third metal layer MTL3, a second interlayer dielectric layer ILD2, a fourth metal layer MTL4, a first via layer VIA1, a second via layer VIA2, a pixel-defining layer PDL, a light-emitting element ED, and an encapsulation layer TFEL.

The substrate SUB may be a base substrate or a base member. The substrate SUB may be a flexible substrate that can be bent, folded, or rolled. For example, the substrate SUB may include, but is not limited to, a glass material or a metal material. As another example, the substrate SUB may include a polymer resin such as polyimide (PI).

The first metal layer MTL1 may be disposed on the substrate SUB. The first metal layer MTL1 may include first and fifth bias electrodes BE1 and BE5. The first metal layer MTL4 may be made up of a single layer or multiple layers including at least one of: molybdenum (Mo), aluminum (Al), chromium (Cr), gold (Au), silver (Ag), titanium (Ti), nickel (Ni), palladium (Pd), indium (In), neodymium (Nd), and copper (Cu).

The buffer layer BF may be disposed on the first metal layer MTL1 and the substrate SUB. The buffer layer BF may include an inorganic insulating material that can prevent the permeation of air or moisture. The buffer layer BF may include, but is not limited to, at least one of: a silicon nitride layer, a silicon oxynitride layer, a silicon oxide layer, a titanium oxide layer, an aluminum oxide layer, and an amorphous silicon layer, or a combination thereof.

The active layer ACTL may be disposed on the buffer layer BF. The active layer ACTL may include the semiconductor region ACT1 and the drain electrode DE1 of the first transistor ST1, the semiconductor region ACT5, the drain electrode DE5 and the source electrode SE5 of the fifth transistor ST5. For example, the active layer ACTL may include an oxide-based active layer. For another example, the active layer ACTL may include low-temperature polycrystalline silicon (LTPS).

The gate insulator GI may be disposed on the active layer ACTL and the buffer layer BF. The gate insulator GI may insulate the active layer ACTL from the second metal layer MLT2. The gate insulator GI may include, but is not limited to, at least one of: a silicon nitride layer, a silicon oxynitride layer, a silicon oxide layer, a titanium oxide layer, an aluminum oxide layer, and an amorphous silicon layer.

The second metal layer MTL2 may be disposed on the gate insulator GI. The second gate layer MTL2 may include the gate electrode GE1 of the first transistor ST1, the gate electrode GE5 of the fifth transistor ST5, and the first capacitor electrode CPE1. The second metal layer MTL2 may be made up of a single layer or multiple layers including at least one of: molybdenum (Mo), aluminum (Al), chromium (Cr), gold (Au), silver (Ag), titanium (Ti), nickel (Ni), palladium (Pd), indium (In), neodymium (Nd), and copper (Cu).

The interlayer dielectric layer ILD1 may be disposed on the second metal layer MTL2 and the gate insulator GI. The first interlayer dielectric layer ILD1 may insulate the second metal layer MTL2 from the third metal layer MTL3. The first interlayer dielectric layer ILD1 may include, but is not limited to, at least one of: a silicon nitride layer, a silicon oxynitride layer, a silicon oxide layer, a titanium oxide layer, an aluminum oxide layer, and an amorphous silicon layer, or a combination thereof.

The third metal layer MTL3 may be disposed on the first interlayer dielectric layer ILD1. The third metal layer MTL3 may include the shielding electrode SDE. The third metal layer MTL3 may be made up of a single layer or multiple layers including at least one of: molybdenum (Mo), aluminum (Al), chromium (Cr), gold (Au), silver (Ag), titanium (Ti), nickel (Ni), palladium (Pd), indium (In), neodymium (Nd), and copper (Cu).

The second interlayer dielectric layer ILD2 may be disposed on the third metal layer MTL2 and the first interlayer dielectric layer ILD1. The second interlayer dielectric layer ILD2 may protect the pixel circuits of the pixels SP. The second interlayer dielectric layer ILD2 may include, but is not limited to, at least one of: a silicon nitride layer, a silicon oxynitride layer, a silicon oxide layer, a titanium oxide layer, an aluminum oxide layer, and an amorphous silicon layer, or a combination thereof.

The fourth metal layer MTL4 may be disposed on the second interlayer dielectric layer ILD2. The fourth metal layer MTL4 may include the driving voltage line VDDL, and the first and third connection electrodes CE1 and CE3. The fourth metal layer MTL4 may be made up of a single layer or multiple layers including at least one of: molybdenum (Mo), aluminum (Al), chromium (Cr), gold (Au), silver (Ag), titanium (Ti), nickel (Ni), palladium (Pd), indium (In), neodymium (Nd), and copper (Cu).

The first via layer VIA1 may be disposed on the fourth metal layer MTL4 and the second interlayer dielectric layer ILD2. For example, the first via layer VIA1 may include, but is not limited to, an organic insulating material such as polyimide (PI).

The second via layer VIA2 may be disposed on the first via layer VIA1. For example, the second via layer VIA2 may include, but is not limited to, an organic insulating material such as polyimide (PI).

The pixel-defining layer PDL may be disposed on the second via layer VIA2. The pixel-defining layer PDL may define emission areas or openings. The pixel-defining layer PDL may separate and insulate the pixel electrodes PE of the pixels SP from one another.

The light-emitting element ED may be disposed on the second via layer VIA2. The light-emitting element ED of each of the pixels SP may include a pixel electrode PE, an emissive layer EL, and a common electrode CAT. The pixel electrode PE may be disposed on the second via layer VIA2. The pixel electrode PE may overlap one of the emission areas defined by the pixel-defining layer PDL. For example, the pixel electrode PE may receive a driving current from the first transistor ST1.

The emissive layer EL may be disposed on the pixel electrode PE. For example, the emissive layer EL may be, but is not limited to, an organic emissive layer made of an organic material. If the emissive layer EL is an organic emissive layer, in case that the pixel circuit of the pixel SP applies a selectable voltage to the pixel electrode AE and the common electrode CAT receives a common voltage or cathode voltage, the holes and electrons may move to the organic emissive layer EL through a hole transporting layer and an electron transporting layer, respectively, and they combine in the organic emissive layer EL to emit light.

The common electrode CAT may be disposed on the emissive layer EL. For example, the common electrode CAT may be implemented in the form of a common electrode extended across all of the sub-pixels SP. The common electrode CAT may be disposed on the emissive layer EL in the emission areas and may be disposed on the pixel-defining layer PDL in areas other than the emission area.

The encapsulation layer TFEL may be disposed on the common electrode CAT to cover the light-emitting diodes ED. The encapsulation layer TFEL may include at least one inorganic film to prevent permeation of oxygen or moisture into the light-emitting elements ED. The encapsulation layer TFEL may include at least one organic film to protect the light-emitting elements ED from particles such as dust.

Figure 8:
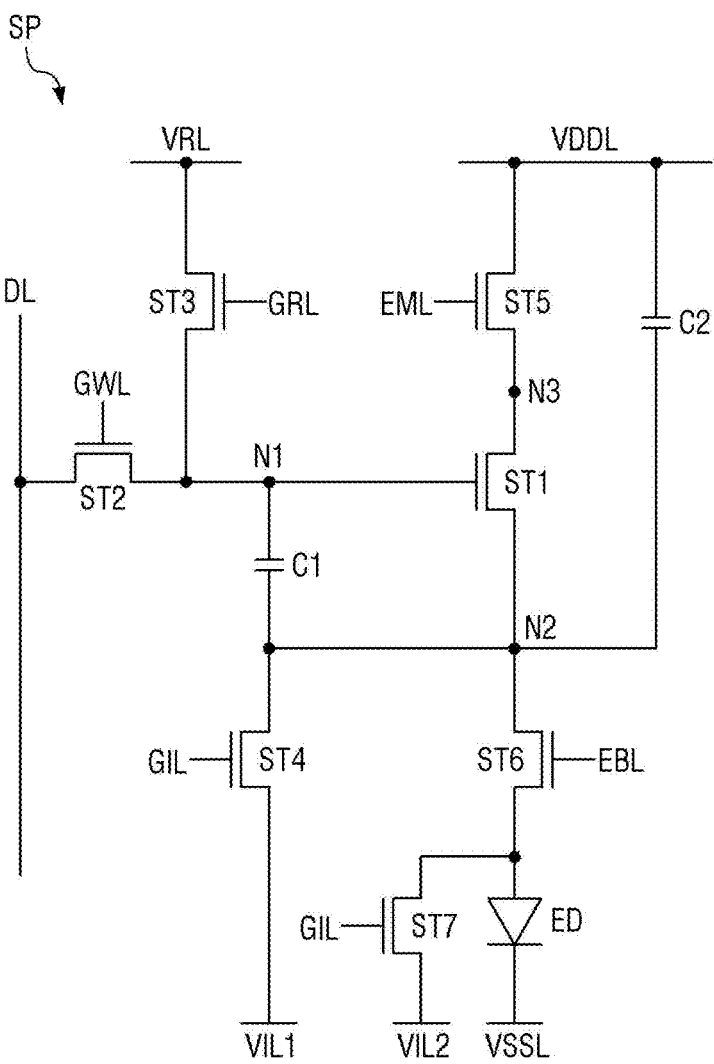
FIG. 8 is a schematic diagram of an equivalent circuit of a pixel of a display device according to an embodiment of the disclosure.

FIG. 8 is a schematic diagram of an equivalent circuit of a pixel of a display device according to an embodiment of the disclosure.

Referring to FIG. 8, each of the pixels SP may be electrically connected to a first gate line GWL, a second gate line GRL, a third gate line GIL, a fourth gate line EBL, an emission control line EML, a data line DL, a reference voltage line VRL, a driving voltage line VDDL, a first initialization voltage line VIL1, a second initialization voltage line VIL2, and a low-level voltage line VSSL.

Each of the pixels SP may include a pixel circuit and a light-emitting element ED. The pixel circuit may include a first transistor ST1, a second transistor ST2, a third transistor ST3, a fourth transistor ST4, a fifth transistor ST5, a sixth transistor ST6, a seventh transistor ST7, a first capacitor C1, and a second capacitor C2.

The first transistor ST1 may include a gate electrode, a source electrode, and a drain electrode. The first transistor ST1 may control a drain-source current (Ids) (or a driving current) based on a data voltage applied to the gate electrode. The driving current (Ids) flowing through the channel of the first transistor ST1 may be proportional to the square of the difference between the threshold voltage (Vth) and the voltage (Vgs) between the gate electrode and the source electrode of the first transistor ST1 ($Ids=k'\times(Vgs-Vth)^2$), where "k" denotes a proportional coefficient determined by the structure and physical properties of the first transistor ST1, "Vgs" denotes the gate-source voltage of the first transistor ST1, and "Vth" denotes the threshold voltage of the first transistor ST1. The gate electrode of the first transistor ST1 may be electrically connected to the first node N1, the drain electrode thereof may be electrically connected to the third node N3, and the source electrode thereof may be electrically connected to the second node N2.

The light-emitting element ED may receive the driving current (Ids) to emit light. The amount or the luminance of the light emitted from the light-emitting element ED may be proportional to the magnitude of the driving current (Ids).

The light-emitting element ED may be an organic light-emitting diode including a first electrode, a second electrode, and an organic light-emitting layer disposed between the first electrode and the second electrode. As another example, the light-emitting element ED may be an inorganic light-emitting element including a first electrode, a second electrode, and an inorganic semiconductor disposed between the first electrode and the second electrode. As another example, the light-emitting element ED may be a quantum-dot light-emitting element including a first electrode, a second electrode, and a quantum-dot emissive layer between the first electrode and the second electrode. As another example, the light-emitting element ED may be a micro light-emitting diode.

The first electrode of the light-emitting element ED may be electrically connected to the source electrode of the sixth transistor ST6 and the drain electrode of the seventh transistor ST7. The second electrode of the light-emitting element ED may be electrically connected to the low-level voltage line VSSL and may receive a low-level voltage from the low-level voltage line VSSL.

The second transistor ST2 may be turned on by a first gate signal of the first gate line GWL to electrically connect the data line DL with the first node N1, which is the gate electrode of the first transistor ST1. The second transistor ST2 may be turned on in response to the first gate signal to apply data voltage to the first node N1. The gate electrode of the second transistor ST2 may be electrically connected to the first gate line GWL, the drain electrode thereof may be electrically connected to the data line DL, and the source electrode thereof may be electrically connected to the first node N1.

The third transistor ST3 may be turned on by the second gate signal of the second gate line GRL to electrically connect the reference voltage line VRL with the first node N1 which is the gate electrode of the first transistor ST1. The third transistor ST3 may be turned on in response to the second gate signal to apply a reference voltage to the first node N1. A gate electrode of the third transistor ST3 may be electrically connected to the second gate line GRL, the drain electrode may be electrically connected to the voltage line VRL, and the source electrode may be electrically connected to the first node N1.

The fourth transistor ST4 may be turned on by a third gate signal of the third gate line GIL to electrically connect the second node N2 which is the source electrode of the first transistor ST1 with the first initialization voltage line VIL1. The fourth transistor ST4 may be turned on based on the third gate signal, thereby discharging the second node N2 to a first initialization voltage. The gate electrode of the fourth transistor ST4 may be electrically connected to the third gate line GIL, the drain electrode thereof may be electrically connected to the second node N2, and the source electrode thereof may be electrically connected to the first initialization voltage line VIL1.

The fifth transistor ST5 may be turned on by an emission signal of the emission control line EML and may electrically connect the driving voltage line VDDL with the drain electrode of the first transistor ST1. A gate electrode of the fifth transistor T5 may be electrically connected to the emission line EML, the drain electrode thereof may be electrically connected to the driving voltage line VDDL, and the source electrode thereof may be electrically connected to the third node N3.

The sixth transistor ST6 may be turned on by a fourth gate signal of the fourth gate line EBL to electrically connect the second node N2 with the first electrode of the light-emitting element ED. The gate electrode of the sixth transistor ST6 may be electrically connected to the fourth gate line EBL, the drain electrode thereof may be electrically connected to the second node N2, and the source electrode thereof may be electrically connected to the first electrode of the light-emitting element ED. In case that all of the fifth transistor ST5, the first transistor ST1 and the sixth transistor ST6 are turned on, the driving current may be supplied to the light-emitting element ED.

The seventh transistor T7 may be turned on by the third gate signal of the third gate line GIL to electrically connect the first electrode of the light-emitting element ED with the second initialization voltage line VIL2. As the seventh transistor ST7 is turned on based on the third gate signal, the first electrode of the light-emitting element ED may be discharged to the second initialization voltage. The gate electrode of the seventh transistor ST7 may be electrically connected to the third gate line GIL, the drain electrode thereof may be electrically connected to the first electrode of the light-emitting element ED, and the source electrode thereof may be electrically connected to the second initialization voltage line VIL2.

Each of the first transistor ST1, the second transistor ST2, the third transistor ST3, the fourth transistor ST4, the fifth transistor ST5, the sixth transistor ST6 and the seventh transistor ST7 may include an oxide-based active layer. The first to seventh transistors ST1, ST2, ST3, ST4, ST5, ST6 and ST7 may have a coplanar structure in which a gate electrode is disposed at the top. The first to seventh transistors ST1, ST2, ST3, ST4, ST5, ST6 and ST7 may be n-type transistors and may output electric current introduced into the drain electrode via the source electrode based on a gate-high voltage applied to the gate electrode. The oxide-based active layer ACTL may have a relatively small S-factor, may increase the constant current driving area in the low gray level region, and may improve low gray level expression.

For another example, at least one of the first transistor ST1, the second transistor ST2, the third transistor ST3, the fourth transistor ST4, the fifth transistor ST5, the sixth transistor ST6 and the seventh transistor ST7 may include an active layer ACTL made of low-temperature polycrystalline silicon (LTPS). The first to seventh transistors ST1, ST2, ST3, ST4, ST5, ST6 and ST7 may be p-type transistors and may output electric current introduced into the source electrode via the drain electrode based on a gate-low voltage applied to the gate electrode.

The first capacitor C1 may be electrically connected between the first node N1, which is the gate electrode of the first transistor ST1, and the second node N2, which is the source electrode of the first transistor ST1. For example, the first electrode of the first capacitor C1 may be electrically connected to the first node N1, the second electrode of the first capacitor C1 may be electrically connected to the second node N2, so that a potential difference between the gate electrode and the source electrode of the first transistor ST1 may be maintained.

The second capacitor C2 may be electrically connected between the driving voltage line VDDL and the second node N2, which is the source electrode of the first transistor ST1. For example, the first electrode of the second capacitor C2 may be electrically connected to the driving voltage line VDDL, the second electrode of the second capacitor C2 may be electrically connected to the second node N2, so that a potential difference between the driving voltage line VDDL and the source electrode of the first transistor ST1 may be maintained.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
    an active layer disposed on a substrate;
    a first metal layer disposed above the active layer;
    a second metal layer disposed above the first metal layer;
    a first transistor comprising a semiconductor region disposed in the active layer, a drain electrode disposed on a first side of the semiconductor region, a source electrode disposed on a second side opposite to the first side of the semiconductor region, and a gate electrode disposed in the first metal layer;
    a first capacitor comprising a first capacitor electrode disposed in the first metal layer and electrically connected to the gate electrode of the first transistor;
    a second capacitor comprising a second capacitor electrode disposed in the first metal layer and electrically connected to a driving voltage line supplying a driving voltage; and

25 a shielding electrode disposed in the second metal layer and overlapping with the first capacitor electrode, the second capacitor electrode, and the drain electrode of the first transistor.

2. The display device of claim 1, further comprising:
a light-emitting element that receives a driving current from the first transistor,
wherein the shielding electrode is electrically connected to a first electrode of the light-emitting element.

3. The display device of claim 1, further comprising:
a first connection electrode disposed in a third metal layer above the second metal layer and electrically connecting the source electrode of the first transistor with the shield electrode.

4. The display device of claim 3, further comprising:
a bias electrode of the first transistor that is disposed in a fourth metal layer below the active layer, overlaps the semiconductor region of the first transistor, and is electrically connected to the shielding electrode through the first connection electrode.

5. The display device of claim 1, further comprising:
a data line supplying a data voltage;
a first gate line supplying a first gate signal; and
a second transistor comprising a semiconductor region disposed in the active layer, a drain electrode electrically connected to the data line, a source electrode electrically connected to the gate electrode of the first transistor, and a gate electrode disposed in the first metal layer and electrically connected to the first gate line.

6. The display device of claim 5, wherein the first and second capacitors are disposed between the first gate line and the first transistor in a plan view.

7. The display device of claim 5, further comprising:
a bias electrode of the second transistor that is disposed in a fourth metal layer below the active layer, overlaps the semiconductor region of the second transistor, and is electrically connected to the gate electrode of the second transistor.

8. The display device of claim 5, further comprising:
a reference voltage line supplying a reference voltage;
a second gate line supplying a second gate signal; and
a third transistor comprising a semiconductor region disposed in the active layer, a drain electrode electrically connected to the reference voltage line, a source electrode electrically connected to the gate electrode of the first transistor, and a gate electrode disposed in the first metal layer and electrically connected to the second gate line.

9. The display device of claim 8, wherein the first and second capacitors are disposed between the second gate line and the first transistor in a plan view.

10. The display device of claim 8, further comprising:
a bias electrode of the third transistor that is disposed in a fourth metal layer below the active layer, overlaps the semiconductor region of the third transistor, and is a part of the second gate line.

11. The display device of claim 8, further comprising:
an initialization voltage line supplying an initialization voltage;
a third gate line supplying a third gate signal; and
a fourth transistor comprising a semiconductor region disposed in the active layer, a drain electrode electrically connected to the source electrode of the first transistor, a source electrode electrically connected to the initialization voltage line, and a gate electrode disposed in the first metal layer and electrically connected to the third gate line.

12. The display device of claim 11, further comprising:
a bias electrode of the fourth transistor that is disposed in a fourth metal layer below the active layer, overlaps the semiconductor region of the fourth transistor, and is a part of the third gate line.

13. The display device of claim 11, further comprising:
an emission control line supplying an emission signal; and
a fifth transistor comprising a semiconductor region disposed in the active layer, a drain electrode electrically connected to the driving voltage line, a source electrode electrically connected to the drain electrode of the first transistor, and a gate electrode disposed in the first metal layer and electrically connected to the emission control line.

14. The display device of claim 13, further comprising:
a bias electrode of the fifth transistor that is disposed in a fourth metal layer below the active layer, overlaps the semiconductor region of the fifth transistor, and is electrically connected to the gate electrode of the fifth transistor.

15. The display device of claim 13, wherein the emission control line is disposed between the third gate line and the first transistor in a plan view.

16. The display device of claim 13, further comprising:
a light-emitting element disposed in a third metal layer on the second metal layer;
a sixth transistor electrically connected between the source electrode of the first transistor and a first electrode of the light-emitting element; and
a seventh transistor discharging a source electrode of the sixth transistor and the first electrode of the light-emitting element.

17. A display device comprising:
a first gate line extended in a first direction and supplying a first gate signal;
a light-emitting element disposed on the first gate line;
a first transistor supplying a driving current to the light-emitting element;
a second transistor supplying a data voltage to a gate electrode of the first transistor based on the first gate signal;
a first capacitor formed between the gate electrode of the first transistor and a source electrode of the first transistor; and
a shielding electrode electrically connected to the source electrode of the first transistor and corresponding to a second electrode of the first capacitor,
wherein the first capacitor is disposed between the first gate line and the first transistor in a plan view.

18. The display device of claim 17, wherein the shielding electrode is disposed on the first transistor and overlaps a drain electrode of the first transistor.

19. The display device of claim 17, further comprising:
a second gate line extended in the first direction and supplying a second gate signal; and
a third transistor supplying a reference voltage to the gate electrode of the first transistor based on the second gate signal,
wherein the first capacitor is disposed between the second gate line and the first transistor in a plan view.

20. The display device of claim 19, further comprising:
a third gate line extended in the first direction and supplying a third gate signal;
an emission control line extended in the first direction and supplying an emission signal;

a fourth transistor discharging a first electrode of the light-emitting element based on the third gate signal; and a fifth transistor supplying a driving voltage to a drain electrode of the first transistor based on the emission signal.

\* \* \* \* \*